United States Patent [19]

O'Connor

[11] Patent Number: 4,760,429
[45] Date of Patent: Jul. 26, 1988

[54] HIGH SPEED RETICLE CHANGE SYSTEM

[75] Inventor: Geoffrey O'Connor, Fairfield, Conn.

[73] Assignee: The Perkin-Elmer Corporation, Norwalk, Conn.

[21] Appl. No.: 927,202

[22] Filed: Nov. 5, 1986

[51] Int. Cl.⁴ .............................................. G03B 27/32
[52] U.S. Cl. ..................................................... 355/77
[58] Field of Search ....................... 355/75, 53, 77, 86, 355/87, 40–43, 45, 99; 269/21

[56] References Cited

U.S. PATENT DOCUMENTS 4,530,635  7/1985  Engelbrecht et al. ............. 269/21 X
4,664,510  5/1987  Weag .................................. 355/99 X Primary Examiner—L. T. Hix
Assistant Examiner—Brian W. Brown
Attorney, Agent, or Firm—Thomas P. Murphy; Edwin T. Grimes; Francis L. Masselle

[57] ABSTRACT

Method and apparatus are disclosed for speeding up reticle changes during the production of semiconductor wafers under those circumstances wherein three reticles are employed, one (C) having a substantially longer exposure period than the others (A, B). The wafer is exposed to the reticles in the sequence ACB-BCA-ACB, etc.

3 Claims, 4 Drawing Sheets

HIGH SPEED RETICLE CHANGE SYSTEM

TECHNICAL FIELD

This invention relates to the production of semiconductor wafers. More particularly, it relates to method and apparatus for rapidly changing the reticles during wafer production.

DISCLOSURE OF INVENTION

Reticles are rapidly transferred between a reticle library and a reticle transport stage by a delivery arm. The reticles comprise a circuit reticle, C, which takes relatively long to expose and A and B reticles having relatively short exposure times. A holding position is established closely adjacent the transport stage. After the circuit reticle is exposed, it is removed to this holding location. A "park" position for the delivery arm is established between the reticle library and the transport stage and relatively closer to the transport stage. While the circuit reticle is in its holding position, reticles A and B traverse a path from the transport stage to the library, from the library to the park position, and from the park position to the transport stage. The exposure cycle for successive wafers is in the order BCA-ACB-BCA-ACB.

BEST MODE FOR CARRYING OUT THE INVENTION

Semiconductor chips are formed by coating a semiconductor wafer disc with a photoresist and exposing it to a pattern carried by a glass "reticle". The process is repeated as many times as required. During the normal production of semiconductor wafers, only three reticles are required to expose the wafer. These reticles are referred to herein as reticles A, B, and C. Reticle A would normally consist of test patterns, reticle B might be clear in order to wipe out unexposed photoresist, and reticle C would contain the circuit to be applied to the wafer. The apparatus to which this invention relates utilizes an illuminated slit for exposing each wafer. Accordingly, a substantially longer period of time is required to expose reticle C than either of reticles A or B.

Figures 1, 4, 5, 6:
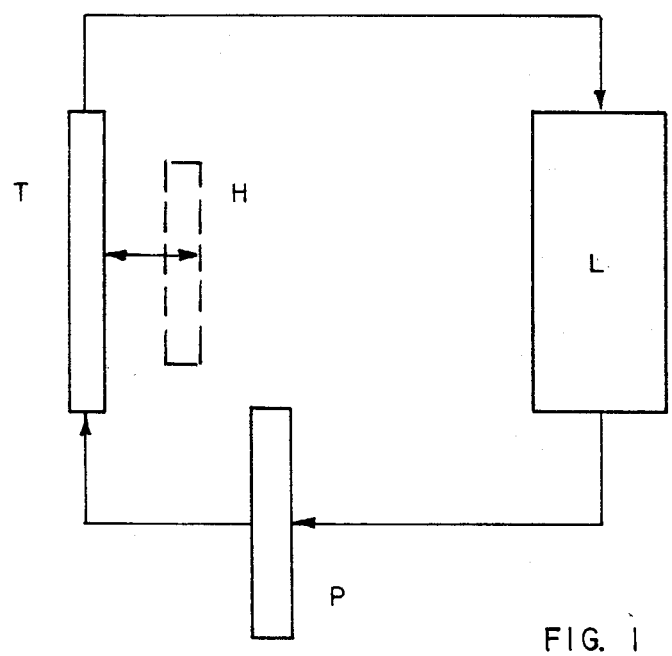
FIG. 1 is a schematic diagram of the reticle flow.
FIGS. 4 and 5 form a diagram illustrating successive steps in the practice of the invention.
FIG. 6 illustrates the relationship between FIGS. 4 and 5.

In order to maximize wafer production, it is important that reticle changes be made as rapidly as possible. The reticle changes are made to and from a transport stage which grips them securely by means of a vacuum chuck and transports them to an exposure station which forms no part of this invention. FIG. 1 illustrates schematically a transport stage T at a loading location, a holding location H located closely adjacent thereto, a reticle library L for storing the reticles between exposures, and a park position P for temporarily supporting a reticle closely adjacent the transport stage prior to its being loaded thereon. The arrows indicate the travel of reticles in the load-unload cycle.

Figure 2:
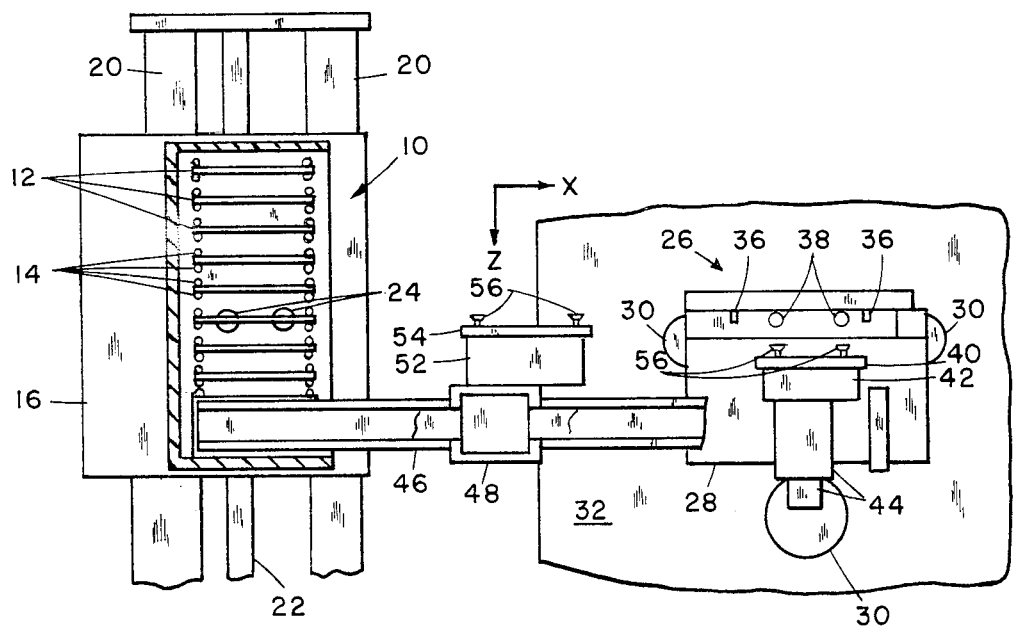
FIG. 2 is a plan view of apparatus usable in the present invention.
Figure 3:
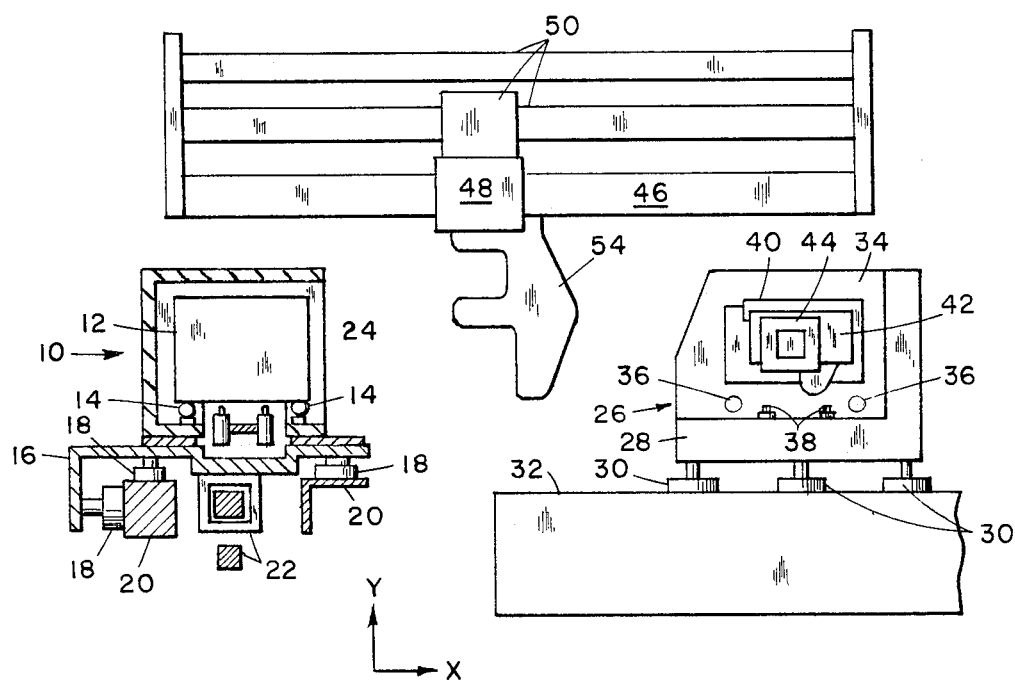
FIG. 3 is a front elevational view of the apparatus of FIG. 2.
Figure 4:
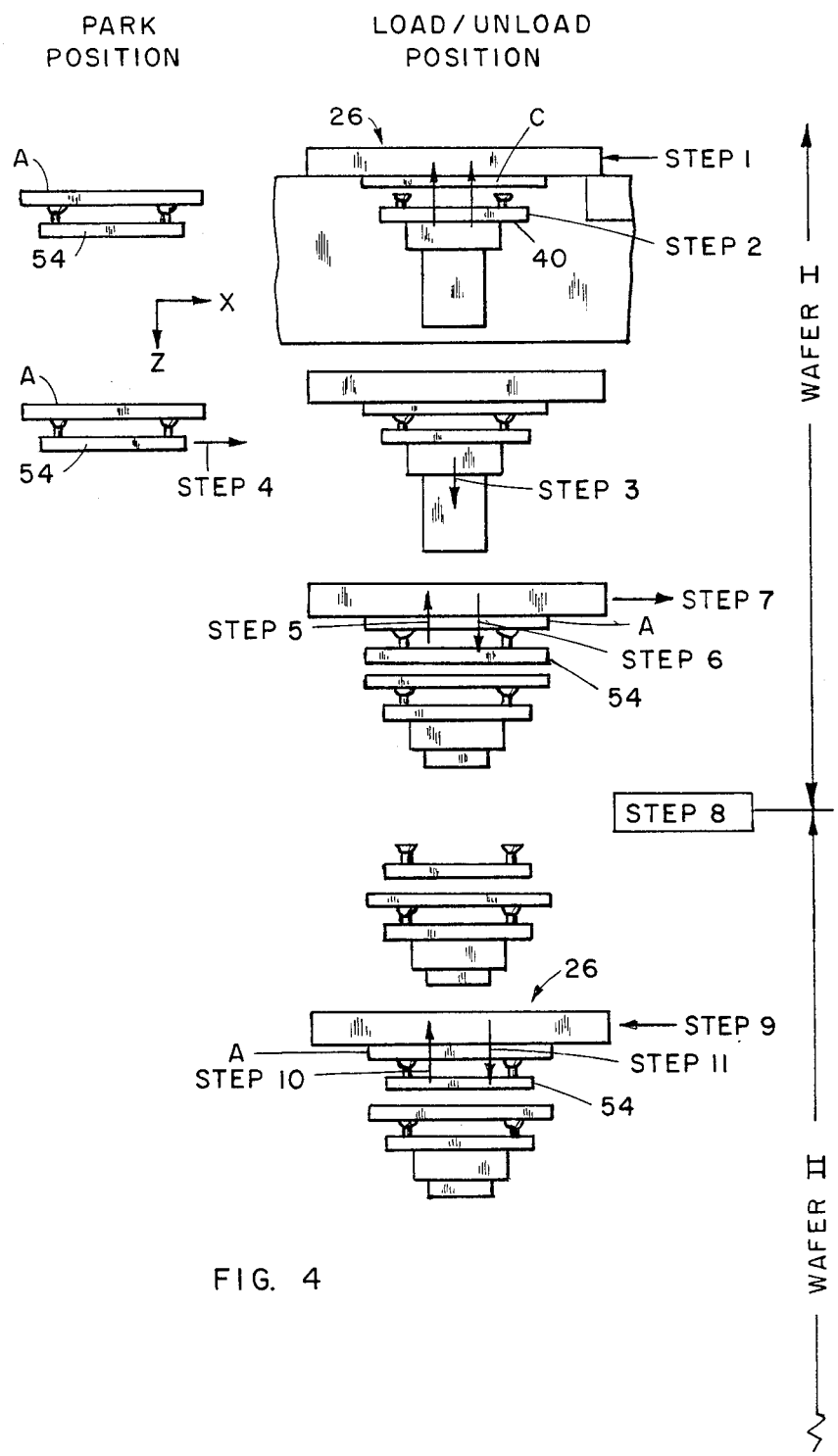
Figure 5:
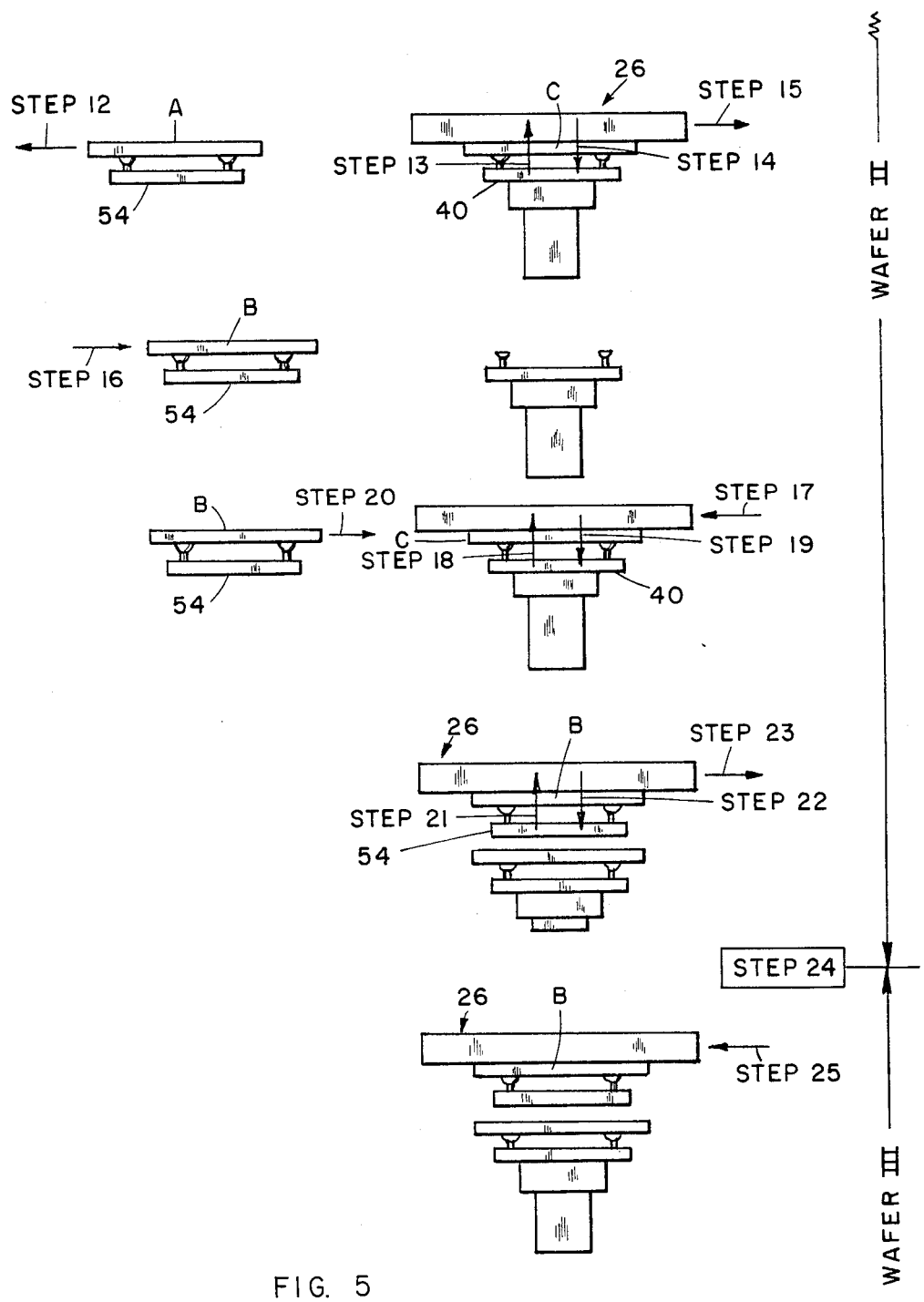

FIGS. 2 and 3 illustrate apparatus for carrying out the invention. It comprises a reticle library 10 carrying reticles 12 supported therein on library pins 14. The reticle library 10 sits on an air bearing carriage 16 which is supported by air bearings 18 on bearing surfaces 20 and driven by a linear motor 22. Thus, the library 10 moves along the Z axis, the X, Y, and Z axes being indicated by arrows in FIGS. 2 and 3. Lifters 24 are positioned beneath the library and function to lift a selected one of the reticles 12 up and off of its library pins 14.

Displaced from the library 10 is a reticle transport stage 26 in the form of a carriage 28 supported by three air bearings 30 on a bearing surface 32. Extending vertically upward from the carriage 28 is a vacuum chuck 34 having reticle support pins 36 for supporting a reticle against the vacuum chuck 34. Positioned below the edge of a reticle so supported are a pair of lifters 38. Positioned closely adjacent and parallel to the vacuum chuck 34 is a reticle load/unload holding arm 40. The holding arm 40 carries pliant rubber vacuum cups 56 of known type for grasping a reticle. The arm 40 is mounted upon a flexure assembly 42 which permits limited movement along the Z axis. This movement is under the control of a conventional air pot which is not shown. Somewhat further motion is provided by mounting the arm 40 and the flexure assembly 42 on an air bearing 44.

Extending between the library 10 and the transport stage 26 is an air bar 46 supporting an air bearing 48 movable therealong by a linear motor 50. A flexure assembly 52 is carried by the air bearing 48 and from it depends a wafer delivery arm 54 which is also provided with pliant vacuum cups 56. Cups of this type are described in U.S. Pat. No. 4,530,635 of Engelbrecht and Laganza. The function of the flexure assembly 52 is to permit limited movement of the load/unload arm 54 in the Z direction for the purpose of acquiring and depositing reticles 12.

It will be understood that the reticles 12 which are likely to be employed in wafer production, are positioned on the pins 14 in the reticle library 10. The library is movable along the Z axis to position a reticle such that the load arm 54 can enter the library without hitting the reticle or the library 10. The airbearing 48 is then moved along the X axis to position the delivery arm 54 adjacent the selected reticle in the library. The library then makes another move along the Z axis to put the arm 54 in the "slot" which holds the reticle. The lifters 24 raise the selected reticle up off the pins 14 and the delivery arm 54 is translated toward it along the Z axis by means of the flexure assembly 52. The vacuum cups 56 carried by the arm 54 are forced up against the selected reticle, vacuum is switched on, and arm 54 thereby acquires the reticle. The lifters 24 thereupon are lowered and the arm 54 retracts along the Z axis. The reticle is now no longer touching the library structure and is free to be moved out of the library.

Delivery arm 54 is then moved along the X axis to the transport stage 26 which is in the load/unload position to receive the reticle. The air driven flexure assembly 52 translates the arm 54 along the Z axis until the reticle contacts the vacuum chuck 34. The vacuum chuck 34 includes both vacuum and pressurized air ports which hold the reticle closely adjacent the chuck 34 while permitting it to move substantially without friction along the face of the chuck. The lifters 38 are raised into contact with the reticle, the vacuum to the delivery arm 54 is switched off, and the arm is retracted. The lifters 38 lower the reticle onto the pins 36 and the vacrum chuck 34 is changed to vacuum alone, thereby causing the reticle to firmly adhere to the chuck.

The next step is to expose a wafer at an exposure station with the reticle. The transfer stage 26 moves away from the load/unload position to the exposure station, which is not illustrated herein. When the exposure is complete, the transfer stage 26 returns to the load/unload position. The selected reticle may be returned to the reticle library 10 by reversing the foregoing procedure. Alternatively, it may be loaded onto the holding arm 40. If this is to be done, the delivery arm 54 must be moved along the X axis toward the library to a position such that it will not interfere with holding arm 40. Holding arm 40 is then translated along the Z axis on the air bearing 44 until it is relatively close to the reticle 12. It is then advanced further by the air actuated flexure assembly 42 and air pressure is restored to the vacuum chuck 34, thereby permitting the reticle 12 to move along its surface in substantially friction-free fashion. The lifters 38 push the reticle up into its load/unload position and the arm 40 is further advanced, permitting the vacuum cups 56 to contact the reticle. Vacuum is then switched on, the lifters 38 are retracted, and the vacuum maintaining the reticle in contact with the vacuum chuck 34 is switched off. The holding arm 40 is then retracted along the Z axis by the flexure assembly 42 and the holding arm is then translated further along the Z axis on the air bearing 44 to a holding position which permits a new reticle to be loaded by the delivery arm 54.

As explained above, during normal production of wafers, only three reticles are required to expose the wafer. These are referred to herein as the reticles A and B, both of which have short exposure times, and the circuit reticle C which has a substantially longer exposure time. It is essential that reticles be interchanged as quickly as possible in order to maximize wafer production. The manner in which this is accomplished will be described with reference to the sequence illustrated beginning at the top of FIG. 4.

Initially, circuit reticle C is on the transport stage 26 which, in turn, is at the exposure station where the reticle is used to expose wafer I. Reticle A is on the delivery arm 54 which is in the park position. The holding arm 40 is empty. Reticle B has already been used to expose wafer I and is currently stored in the reticle library. Given these initial conditions, the following steps occur:

Step 1. The transport stage 26 exposes the wafer I with the circuit reticle C and returns to the load/unload position as illustrated.

Step 2. The holding arm 40 translates along the Z axis and acquires the circuit reticle C.

Step 3. The holding arm 40 retracts to the holding position along the Z axis.

Step 4. Delivery arm 54 translates along the X axis to the load/unload position with reticle A.

Step 5. The delivery arm 54 translates along the Z axis and loads reticle A onto transport stage 26.

Step 6. The delivery arm 54 retracts along the Z axis until it just clears reticle A.

In an actual embodiment of this invention, the total time to exchange reticles by completing steps 1-6 was no more than 3 seconds.

Step 7. The transport stage 26 moves away to expose reticle A.

Step 8. The exposure of wafer I with reticle A, reticle B, and reticle C has been completed and wafer I is replaced by wafer II.

Step 9. Transport stage 26 exposes wafer II with reticle A and returns to the load/unload position.

Step 10. The delivery arm 54 translates along the Z axis and acquires reticle A.

Step 11. The delivery arm 54 retracts along the Z axis with reticle A.

Step 12. The delivery arm 54 with reticle A translates along the X axis to the park position.

Step 13. The holding arm 40 loads reticle C onto transport stage 26.

Step 14. The holding arm 40 retracts along the Z axis until it just clears the reticle C.

The total time required to exchange reticles by completing steps 9-14 is no greater than 3 seconds.

Step 15. The transport stage 26 moves away to expose the wafer II with reticle C.

Step 16. While the transport stage 26 is exposing wafer II with reticle C, the delivery arm 54 has translated along the X axis, exchanged reticle A for reticle B at the library 10, and has now translated back along the X axis from the library to the park position.

The time required to complete step 16 is no greater than 20 seconds. Since, during this period, the wafer II is being exposed by reticle C, this trip to and from the library does not add to the cycle time.

Step 17. The transport stage 26 exposes wafer II with the reticle C and returns to the load/unload position. Transport stage 26 prepares to unload reticle C as previously explained.

Step 18. The holding arm 40 translates along the Z axis and acquires reticle C.

Step 19. The holding arm 40 retracts along the Z axis to its holding position.

Step. 20. The delivery arm 54 moves along the X axis from its park position to the load/unload position with reticle B.

Step 21. The delivery arm 54 translates along the Z axis and loads reticle B onto transport stage 26.

Step 22. The delivery arm 54 retracts along the Z axis until it just clears reticle B.

The total time required to exchange reticles by completing step 17-22 is no more than 3 seconds.

Step 23. Transport stage 26 moves away to begin the exposure of wafer II with reticle B.

Step 24. The exposure of wafer II with reticle B is completed. Wafer II has now been exposed by reticle A, reticle B, and reticle C and the wafer is replaced by wafer III.

Step 25. The cycle now returns to step 9. Transport stage 26 exposes wafer III with reticle B and returns to the load/unload position.

The cycle continues, exposing as many wafers as are required to the reticles A, B, and C. It will be noted that the exposure cycle is in the order BCA-ACB-BCA-ACB, i.e., (a) the reticle having the longest exposure time is preceded and followed by the reticles having the shortest exposure time, and (b) the reticle last employed to expose a wafer is the first reticle employed to expose the succeeding wafer. By means of this technique, the time required to change reticles is reduced to a minimum.

It is believed that the many advantages of this invention will be apparent to those skilled in the art. It will also be apparent that a number of variations and modifications may be made in this invention without departing from its spirit and scope. Accordingly, the foregoing description is to be construed as illustrative only, rather than limiting. This invention is limited only by the scope of the following claims.

I claim:

1. In the method of sequentially loading three reticles onto an exposure stage at a loading location for subsequently exposing each of a plurality of semiconductor wafers to each of said reticles, wherein one of said reticles is a circuit reticle (C) having a substantially longer exposure time than the remaining two reticles and wherein said remaining two reticles (A,B) are normally stored in a reticle library relatively far removed from the loading location, the improvement comprising:

positioning reticle C in a holding location closely adjacent the loading location;
positioning reticle A on the exposure stage;
establishing a park position intermediate the library and the loading location;
exposing a wafer with reticle A;
removing reticle A from the exposure stage;
positioning reticle C on the exposure stage;
exposing said wafer with reticle C;
during the reticle C exposure period, moving reticle A to the library and removing reticle B from the library to the park position;
moving reticle C to its holding location;
positioning reticle B on the exposure stage;
exposing said wafer with reticle B;
replacing the exposed wafer with an unexposed wafer and continuing the exposure cycle in the order BCA-ACB-BCA-ACB.

2. In the method of serially exposing each of a plurality of semiconductor wafers to at least three reticles, a first of said reticles having a substantially longer exposure period than the second and third of said reticles, wherein said reticles are moved from a library location to a transport stage at a loading location for subsequent exposure, the improvement which comprises:

positioning one of said second and third reticles on said transport stage at said loading location;
positioning the other of said second and third reticles at said library location;
positioning said first reticle at a holding location closely adjacent the loading location;
moving said transport stage away from said loading location for a time period at least as long as the exposure period of the reticle positioned thereon;
returning said transport stage and reticle to said loading location;
removing said one reticle from said transport stage and moving it toward said library location;
loading said first reticle onto said transport stage from its holding location;
moving said transport stage away from said loading location for a first time period at least as long as the first reticle exposure period;
repositioning said one reticle at the library location during said first time period;
removing the other of said second and third reticles from said library location to an intermediate park location during said first time period;
returning said transport stage and first reticle to said loading location;
removing said first reticle from said transport stage to said holding location;
positioning said other reticle from said park location onto said transport stage;
moving said transport stage away from said loading location for a time period at least as long as the exposure period of said other reticle;
returning said transport stage and said other reticle to said loading location;
replacing the wafer exposed during the preceding steps with an unexposed wafer; and
sequentially repeating the process for each subsequent wafer.

3. In the method of serially exposing each of a plurality of semiconductor wafers to at least three reticles, a first of said reticles having a substantially longer exposure period than the second and third of said reticles, wherein said reticles are moved from a library location to a transport stage at a loading location for subsequent exposure, the improvement which comprises:

loading said first reticle onto said transport stage at said loading location;
moving said transport stage away from said loading location for a first time period at least as long as the first reticle exposure period;
positioning said second reticle at a park location intermediate said library location and said loading location;
positioning said third reticle at said library location;
returning said transport stage and first reticle to said loading location;
removing said first reticle from said transport stage to a holding location closely adjacent the loading location;
loading said second reticle onto said transport stage at said loading location;
moving said transport stage away from said loading location for a second time period at least as long as the second reticle exposure period;
returning said transport stage and second reticle to said loading location;
replacing a first, exposed, wafer with a second, unexposed, wafer;
moving said transport stage away from said loading location for a second time period at least as long as the second reticle exposure period;
returning said transport stage and second reticle to said loading location;
removing said second reticle from said transport stage and moving it toward said library location;
loading said first reticle onto said transport stage from its holding location;
moving said transport stage away from said loading location for a first time period at least as long as the first reticle exposure period;
repositioning the second reticle at the library location during said first time period;
removing said third reticle from said library location to said park location during said first time period;
returning said transport stage and first reticle to said loading location;
removing said first reticle from said transport stage to said holding location;
positioning said third reticle from said park location onto said transport stage;
moving said transport stage away from said loading location for a third time period at least as long as the third reticle exposure period;
returning said transport stage and third reticle to said loading location;
replacing the second, exposed, wafer with a third, unexposed, wafer; and
sequentially repeating the process for each subsequent wafer.

* * * * *